United States Patent
Yoshimura et al.

(10) Patent No.: US 8,039,282 B2
(45) Date of Patent: Oct. 18, 2011

(54) SEMICONDUCTOR OPTICAL DEVICE AND METHOD OF FABRICATING THE SAME

(75) Inventors: Manabu Yoshimura, Yokohama (JP); Nobuyuki Ikoma, Yokohama (JP); Kenji Hiratsuka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 169 days.

(21) Appl. No.: 12/414,095

(22) Filed: Mar. 30, 2009

(65) Prior Publication Data
US 2009/0252190 A1 Oct. 8, 2009

(30) Foreign Application Priority Data

Apr. 2, 2008 (JP) ................................ 2008-096354

(51) Int. Cl.
*H01S 5/223* (2006.01)
*H01L 21/00* (2006.01)

(52) U.S. Cl. .................... 438/39; 372/45.01; 372/46.01; 257/E21.002; 257/615

(58) Field of Classification Search .................. 438/39
See application file for complete search history.

(56) References Cited

U.S. PATENT DOCUMENTS

| | | | | |
|---|---|---|---|---|
| 4,852,111 A | * | 7/1989 | Hayakawa et al. | 372/45.01 |
| 5,093,278 A | * | 3/1992 | Kamei | 438/40 |
| 5,227,015 A | * | 7/1993 | Fujihara et al. | 438/40 |
| 5,665,612 A | * | 9/1997 | Lee et al. | 438/40 |
| 6,110,756 A | * | 8/2000 | Otsuka et al. | 438/41 |
| 6,664,605 B1 | * | 12/2003 | Akulova et al. | 257/432 |
| 7,449,723 B2 | * | 11/2008 | Massa et al. | 257/97 |
| 7,456,040 B2 | * | 11/2008 | Yamazaki et al. | 438/41 |
| 2007/0155031 A1 | * | 7/2007 | Yamazaki et al. | 438/22 |

FOREIGN PATENT DOCUMENTS

JP 3-112185 5/1991

* cited by examiner

*Primary Examiner* — N Drew Richards
*Assistant Examiner* — Robert Carpenter
(74) *Attorney, Agent, or Firm* — Smith, Gambrell & Russell, LLP

(57) ABSTRACT

In a method of fabricating a semiconductor optical device, a semiconductor region is formed by growing an InP lower film, a active region, an InP upper film and a capping film on a substrate sequentially. Material of the capping film is different from that of InP. Next, a mask is formed on the capping film, and the semiconductor region is etched using the mask to form a semiconductor stripe mesa, which includes an InP lower cladding layer, a active layer, an InP upper cladding layer and a capping layer. The active layer comprises aluminum-based III-V compound. A width of the top surface of the capping layer is greater than that of a width of the bottom surface of the capping layer. A width of the top surface of the InP upper cladding layer is smaller than that of the bottom surface of the InP upper cladding layer. The minimum width of the semiconductor mesa is in the InP upper cladding layer. After forming the semiconductor stripe mesa, thermal process of the semiconductor mesa is carried out in an atmosphere to form a mass transport semiconductor on a side of the InP upper cladding layer, and the atmosphere contains V-group material.

16 Claims, 11 Drawing Sheets

SEMICONDUCTOR OPTICAL DEVICE AND METHOD OF FABRICATING THE SAME

BACKGROUND OF THE INVENTION

1. Field of the Invention

The present invention relates to a semiconductor optical device and a method of fabricating a semiconductor laser.

2. Related Background Art

Publication 1 (Japanese Patent Application Laid Open No. H03-112185) discloses a semiconductor laser of a mesa structure. The mesa structure is formed on an InP substrate in the following manner. An InP lower cladding layer, an InGaAsP active layer, an InP upper cladding layer, and an InGaAs capping layer are grown thereon and these semiconductor layers are etched by use of a stripe mask. A burying semiconductor region is grown on the side of the mesa structure and the substrate. Alternatively, an AlGaInAs active layer may be used instead of the InGaAsP active layer.

SUMMARY OF THE INVENTION

Temperature characteristics of active layers made of Al-based semiconductor material are superior to those of GaInAsP. When an active layer of the mesa structure is made of Al-based material, an etching rate of the Al-based semiconductor is greater as compared with that of InGaAsP. As shown in FIG. 8, the side of the mesa structure has the following shape: both edges "P" of the bottom surface of the InP upper cladding layer 26A are inside with reference to both edges "Q" of the top surface of the upper InP cladding layer. When a burying semiconductor layer is grown on the side of the mesa structure, in the initial deposition stage of its growth, the deposition rate in the growth of the burying semiconductor layer on the InP cladding layers is greater than that of the burying semiconductor layer on the active layer, as shown in FIG. 10, which prevents the highly accurate control of the formation of the burying layer.

It is an object to provide a method of fabricating a semiconductor optical device, and this semiconductor optical device can reduce a leakage current.

One aspect of the present invention relates to a method of fabricating a semiconductor optical device. The method comprises the steps of: forming a semiconductor region by growing an InP lower film, an active region, an InP upper film and a capping film on a semiconductor surface sequentially, material of the capping film being different from that of InP, the active layer including a semiconductor layer, and the semiconductor layer of the active layer being made of aluminum-based III-V compound; forming a mask on the capping film; etching the semiconductor region using the mask to form a semiconductor stripe mesa, the semiconductor stripe mesa including an InP lower cladding layer, a active layer, an InP upper cladding layer and a capping layer, a width of a top surface of the capping layer being greater than that of a bottom surface of the capping layer, a width of a top surface of the InP upper cladding layer being smaller than that of a bottom surface of the InP upper cladding layer, and a minimum width of the semiconductor stripe mesa being in the InP upper cladding layer; and, after forming the semiconductor stripe mesa, performing a thermal process of the semiconductor stripe mesa in an atmosphere to form a mass transport semiconductor on a side of the InP upper cladding layer by mass transport, the mass transport semiconductor being grown by the mass transport on a side of the semiconductor stripe mesa in the atmosphere, the atmosphere including V-group material containing a phosphorus.

In the method according to the present invention, the method further comprises the step of, after performing the thermal process, growing an InP burying layer on the substrate and the semiconductor stripe mesa. In the method according to the present invention, the capping layer is made of InGaAs. In the above method according to the present invention, forming a semiconductor stripe mesa includes the steps of: selectively etching the capping film of the semiconductor region using a first etchant to form the capping layer; and, after selectively etching the capping film, etching a remaining portion of the semiconductor region using a second etchant to form the semiconductor stripe mesa. The first etchant has an etching rate of InGaAs greater than InP. In the method according to the above invention, the second etchant contains Br alcohol. The method further comprises the step of, prior to forming the mask, oxidizing a surface of the InGaAs layer to form an oxidation layer, the mask being formed on the oxidation layer.

In the method according to the invention, growing the InP burying layer includes the steps of: growing an undoped InP layer; a first InP layer doped with one of p-type dopant and n-type dopant; and a second InP layer doped with another of p-type dopant and n-type dopant. In the method according to the invention, the mass transport semiconductor is made of III-V compound and has a side surface, and the side surface includes one of (-110) and (1-10) of the III-V compound. In the method according to the invention, the active layer includes an AlGaInAs semiconductor layer. In the method according to the invention, the atmosphere contains phosphine ($PH_3$) or V-group organic metal material containing a phosphorus. In the method according to the invention, the width of a top surface of the active layer is greater than that of a bottom surface of the active layer.

The method comprises the step of, after growing the InP burying layer, removing the capping layer. The method comprises the step of, after removing the capping layer, growing another InP upper cladding layer on the semiconductor stripe mesa and the InP burying layer. In the method according to the invention, the thermal process is performed in a reactor, and III-group organic metal raw material is not supplied to the reactor during the thermal process. The method further comprises the step of preparing a substrate, the substrate having a primary surface, and the semiconductor region is formed on the primary surface. In the method according to the invention, the semiconductor stripe mesa extends in x-axis of a Cartesian coordinate system. The top surface of the InP upper cladding layer has first and second edges, and the first and second edges extend in the x-axis of the Cartesian coordinate system. The bottom surface of the InP upper cladding layer has third and fourth edges, and the third and fourth edges extend in the x-axis of the Cartesian coordinate system. The first to fourth edges have first to fourth y-coordinate positions in y-axis of the Cartesian coordinate system, and the first and second y-coordinate positions are between the third and fourth y-coordinate positions on the y-axis of the Cartesian coordinate system. The InP lower cladding layer, the active layer and the InP upper cladding layer are arranged on the primary surface in z-axis of the Cartesian coordinate system. In the method according to the invention, the semiconductor optical device includes a semiconductor laser.

Another aspect of the present invention relates to a semiconductor optical device. This device comprises: a semiconductor stripe mesa on a substrate, the semiconductor stripe mesa including an InP lower cladding layer, an active layer and an InP upper cladding layer, a width of a top surface of the upper InP cladding layer being equal to or smaller than that of a bottom surface of the InP upper cladding layer; first and second mass transport semiconductor portions on both sides of the InP upper cladding layer, respectively, the first and second mass transport semiconductor portions having first and second sides, respectively, the interval between the first and second sides being greater than the width of the top surface of the InP upper cladding layer; and an InP burying layer on the first and second mass transport semiconductor portions, the semiconductor region and the semiconductor stripe mesa. In the semiconductor optical device according to the present invention, the first and second mass transport semiconductor portions are made of III-V compound, and each of the first and second sides includes one of (-110) and (1-10) of the III-V compound. In the semiconductor optical device according to the present invention, the semiconductor stripe mesa extends in x-axis of a Cartesian coordinate system. The top surface of the InP upper cladding layer has first and second edges, and the first and second edges extend in the x-axis of the Cartesian coordinate system. The bottom surface of the InP upper cladding layer has third and fourth edges, and the third and fourth edges extend in the x-axis of the Cartesian coordinate system. The first to fourth edges have first to fourth y-coordinate positions in y-axis of the Cartesian coordinate system, and the first and second y-coordinate positions are between the third and fourth y-coordinate positions in the y-axis of the Cartesian coordinate system. The InP lower cladding layer, the active layer and the InP upper cladding layer are arranged on a primary surface of the substrate in z-axis of the Cartesian coordinate system.

BRIEF DESCRIPTION OF THE DRAWINGS

The above objects and other objects, features, and advantages of the present invention will be understood easily from the following detailed description of the preferred embodiments of the present invention with reference to the accompanying drawings.

DETAILED DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of a method of fabricating a semiconductor optical device of the present invention will be explained. When possible, parts identical to each other will be referred to with symbols identical to each other.

Figure 1:
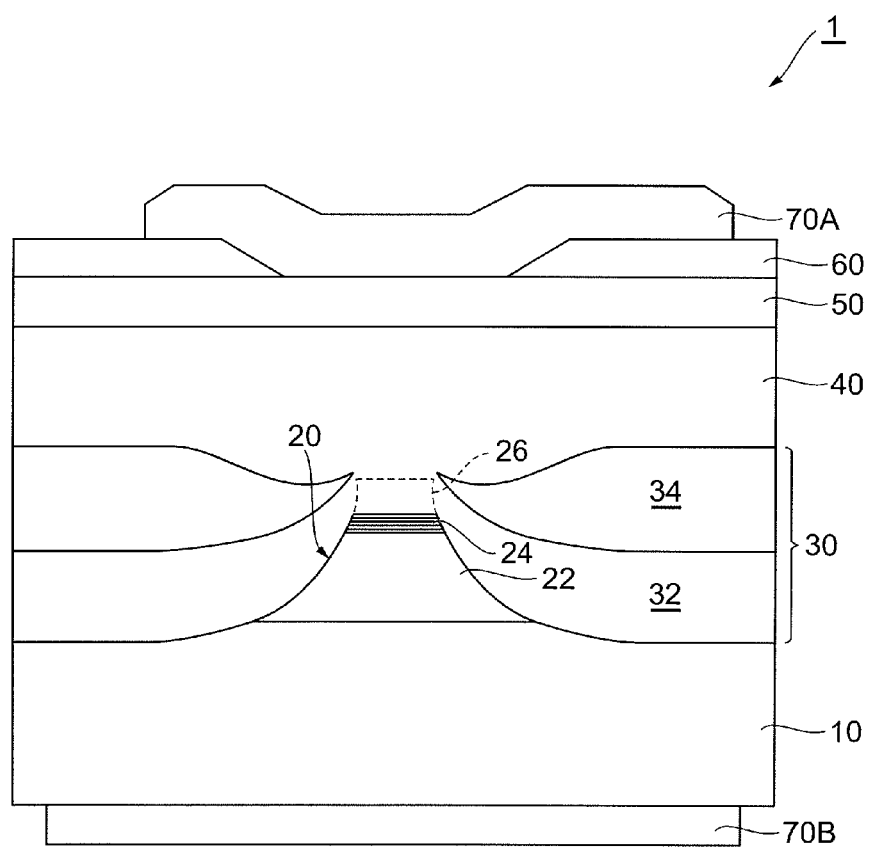
FIG. 1 is a schematic view showing a cross section of a semiconductor laser according to the present invention.

FIG. 1 is a schematic view showing a cross section of a semiconductor laser according to the present invention. A semiconductor laser 1 has an optical waveguide which extends in a predetermined axis, and has a buried heterostructure. The cross section in FIG. 1 is taken along a plane perpendicular to the predetermined axis.

With reference to FIG. 1, the semiconductor laser 1 comprises a InP substrate 10, which has n-conductivity type. On the InP substrate 10, a semiconductor mesa 20 is provided. The semiconductor mesa 20 includes an InP lower cladding layer 22, an AlGaInAs active layer 24, and an InP upper cladding layer 26, and these layer 22, 24 and 26 are arranged on the primary surface of the InP substrate 10 sequentially.

On the both sides of the semiconductor mesa 20, an InP burying region 30 is grown. The InP burying region 30 may include a number of semiconductor layers grown thereon, which are grown all over the sides of the semiconductor mesa 20 sequentially. An InP cladding layer 40 is grown over the semiconductor mesa 20 and the InP burying region 30, and a contact layer 50 is grown on the InP cladding layer 40. On the contact layer 50, an insulating layer 60 is formed, and this insulating layer 60 has an opening located on the top of the semiconductor mesa 20. The contact layer 50 is exposed in the opening. On the contact layer 50 and the insulating layer 60, a first electrode 70A, such as an anode, is formed to cover the opening and the insulating layer 60. On the backside of the InP substrate 10, a second electrode 70B, such as cathode, is formed.

In the subsequent description, the method of fabricating the semiconductor laser 1 as described above is explained in detail. In the present embodiment, metal organic vapor phase epitaxy (MOVPE) can be used in the following epitaxial growth. DEZn can be used as p-type dopant, and silane can be used as n-type dopant.

Figure 2:
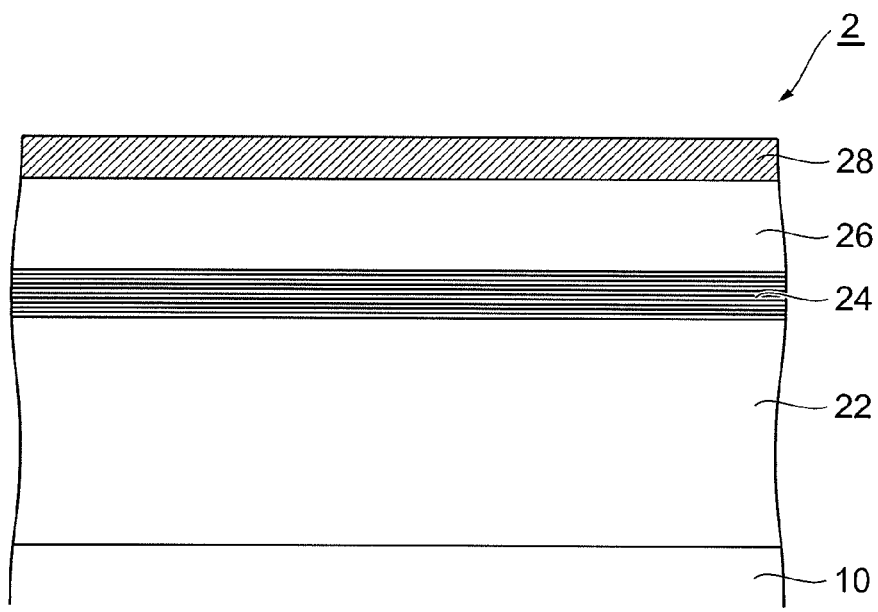
FIG. 2 is a schematic view showing a step of forming a semiconductor region in the method according to the present embodiment.

In the fabrication of the semiconductor laser 1, the InP substrate 10 is prepared. The primary surface of the InP substrate 10 can be (100)-face, and semiconductor is deposited on this surface to form a semiconductor region 2 on the primary surface of the InP substrate 10, as shown in FIG. 2. The semiconductor region 2 includes an n-type lower cladding layer 22 of InP, an active layer 24 of AlGaInAs, and a p-type upper cladding layer 26 of InP, and a capping layer 28 of p-type InGaAs, and these layers are grown on the InP substrate 10 sequentially.

Figure 3:
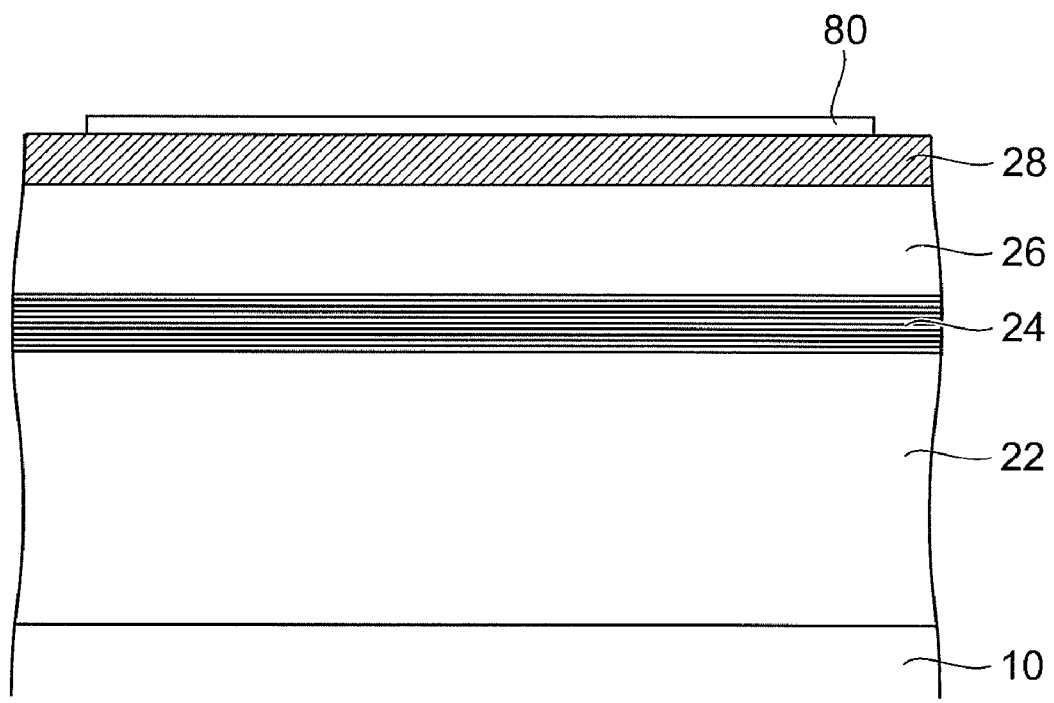
FIG. 3 is a schematic view showing a step forming a mask for defining a mesa stripe in the present method.

As shown in FIG. 3, a mask 80 is formed on the capping layer 28, and in the present example, the mask 80 is formed by use of photo-lithography technique. The mask 80 has a stripe shape, which extends in <110> direction of InP. The material of the insulating film can be silicon oxide and SiON as well as SiN. In required, the surface of the capping layer 28 of p-type InGaAs can be oxidized to form the oxidization layer, and an insulating film, such as SiN, for the mask 80 is grown on the oxidization layer. This oxidization of p-type InGaAs can be carried out at the temperature of 350 degrees Celsius for ten minutes in the atmosphere containing oxygen.

Then, the first wet etching of the semiconductor region 2 is carried out by use of the mask 80. The etchant for use in the first wet etching is, for example, mixture of phosphoric acid, hydrogen peroxide and purified water, and the mixture ratio is as follows (phosphoric acid: hydrogen peroxide:purified water=5:1:40). The etching is performed in a quartz container at the temperature of 25 degrees Celsius for 60 seconds. In this etching step, the uppermost layer, i.e., InGaAs layer, is selectively etched, and the underlying layer, i.e., the InP upper cladding layer, remains unetched, but side-etching of the InGaAs layer occurs just below the stripe mask 80.

Figure 4:
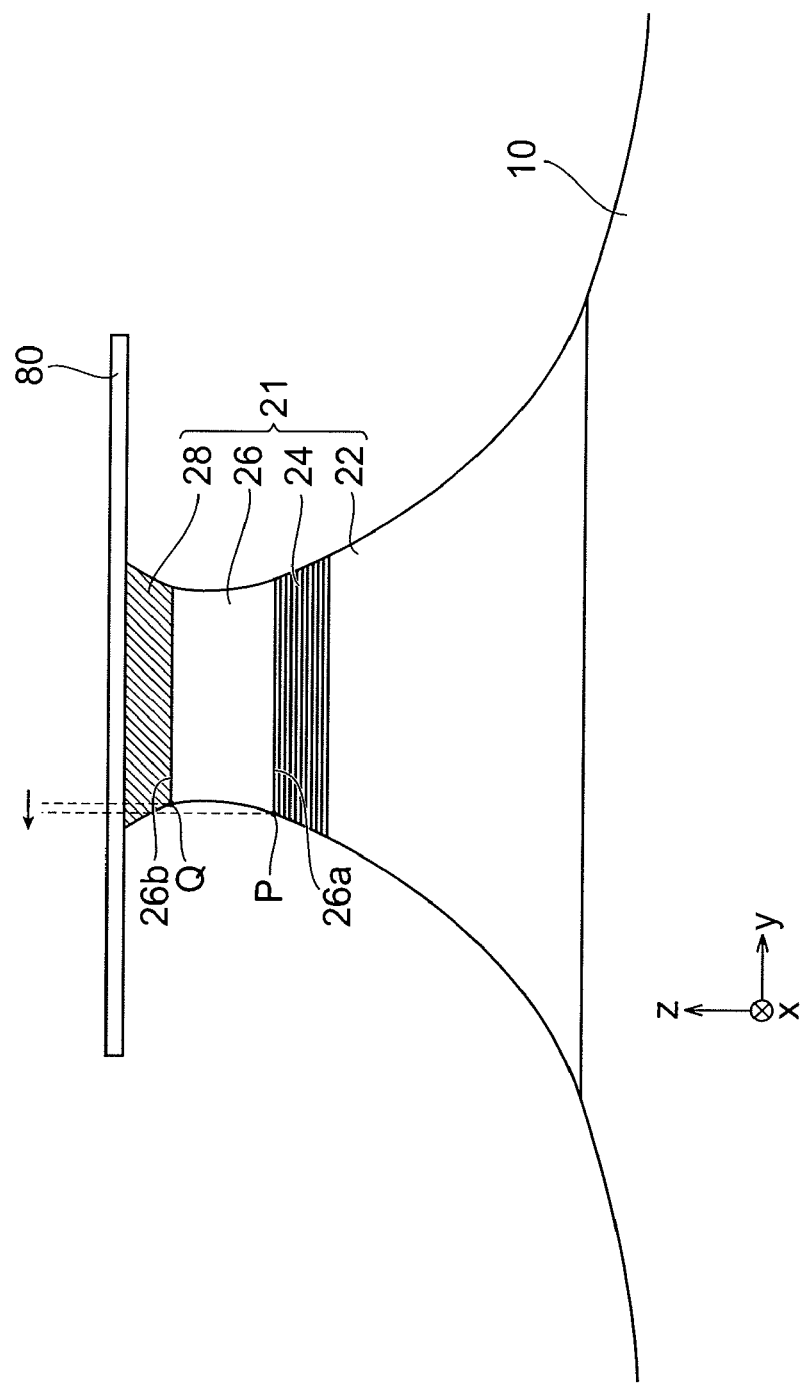
FIG. 4 is a schematic view showing a step in etching the semiconductor region in the present method.
Figure 5:
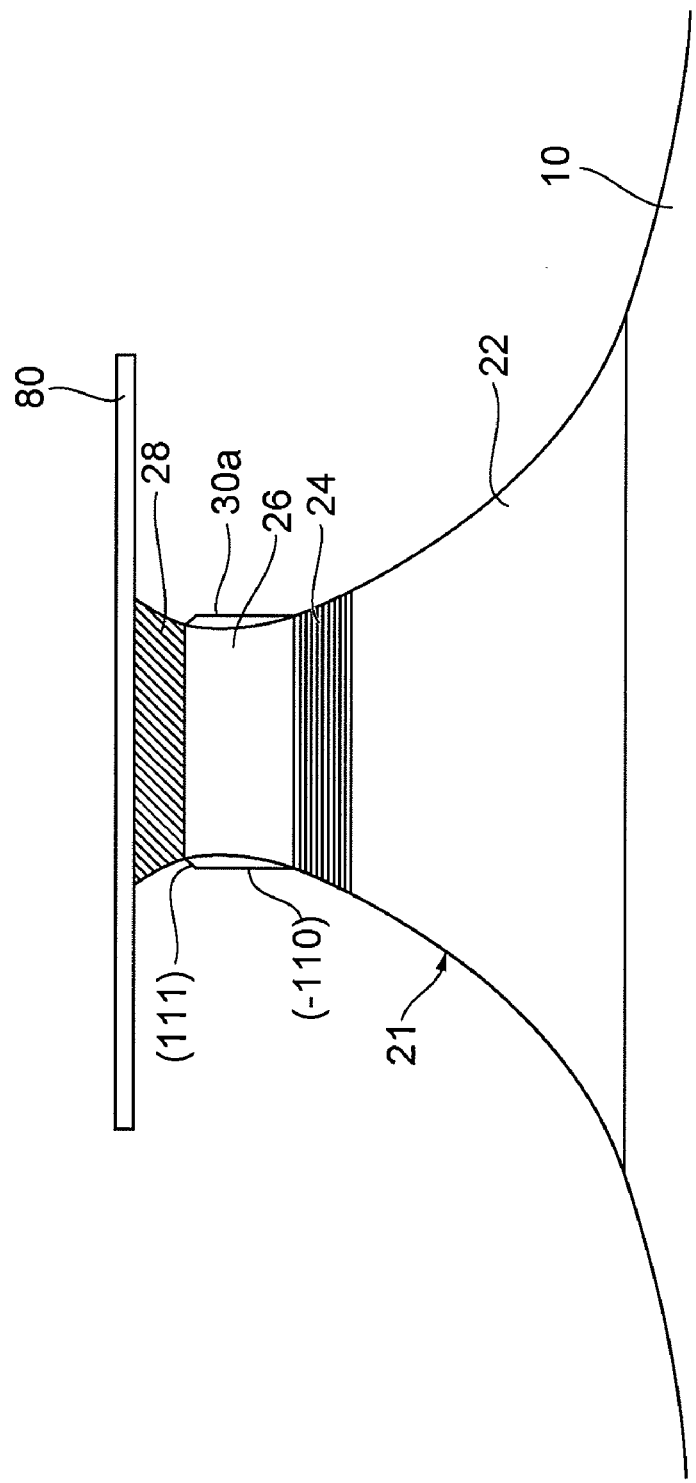
FIG. 5 is a schematic view showing a step of carrying out mass transport in the present method.

Next, the second wet etching of the remaining of the semiconductor region 2 is carried out by use of the mask 80. The etchant for use in the second wet etching is, for example, Br-methanol. The mixture of methanol and bromine, which is cooled by ice-cold water, is prepared, and the mixture ratio is as follows (bromine: methanol=1:400). In the etching step, the depth of the etching is, for example, about 2.4 micrometers, and the width of the active layer is, for example, about 1.1 micrometers due to the side etching thereof. The etchant of the second wet etching has a less etching selectivity than that of the first etching. The etching rates of semiconductor layers in the remaining semiconductor region 2 are about the same. The two steps of etching as above can form the shape of the semiconductor mesa 21 as shown in FIG. 4. The semiconductor mesa 21 includes the lower cladding layer 22, the active layer 24, the upper cladding layer 26 and the capping layer 28, which are provided on the substrate 10 sequentially.

In the present semiconductor mesa 20, the semiconductor layer 22, 24 and 26 are arranged in the direction of z-axis of the Cartesian coordinate system shown in FIG. 4, and the z-axis is directed to the normal line of the primary surface of the InP substrate 10. The semiconductor mesa 21 extends in the direction of x-axis of the Cartesian coordinate system, and the x-axis is perpendicular to the normal line. The InP upper cladding layer 26 has a width, which is defined as the interval of both sides of the InP upper cladding layer 26. This interval is taken along y-axis of the Cartesian coordinate system, and the y-axis is perpendicular to the x- and z-axes. The width of the capping layer 28 is also defined as the interval of its sides. The InP upper cladding layer 26 is divided into the lower and upper half parts of the same thickness, which are arranged in the direction of the z-axis. In the InP upper cladding layer 26, the width of the lower half part is gradually decreased in the direction of the substrate 10 to the InP upper cladding layer 26, i.e., the z direction. In the upper half part of the InP upper cladding layer, the width of the upper half part is gradually decreased and then gradually increased in the direction of the substrate 10 to the InP upper cladding layer 26, and the upper half part has the minimum width. The width of the capping layer 28 is gradually increased in the direction of the substrate 10 to the InP upper cladding layer 26, i.e., the z direction. Accordingly, the lower half of the semiconductor mesa 20 is shaped like a normal mesa, whereas the upper half of the semiconductor mesa 20 is shaped like an inverted mesa. In the cross section of the semiconductor mesa 21, which is shown in FIGS. 1 and 4, the position "P" of one edge of the bottom surface 26a of the InP upper cladding layer 26 is located outward (the arrow mark in FIG. 4 indicates the direction of "outward") with reference to the position "Q" of one edge of the upper surface 26b of the upper cladding layer 26.

In the step of forming the stripe mask 80, the surface of the capping layer 28 can be oxidized before forming the stripe mask 80, as described above. The oxidation layer facilitates the side etching in the etching of the capping layer 28. In the semiconductor mesa 21, the minimum width is located in the upper half part of the upper cladding layer. The upper portion of the upper half part has a inverted mesa, whereas the lower half portion of the upper half part has a normal mesa. This process can provide better reproducibility of the mesa shape in the present fabrication method as follows: the position "P" of one edge of the bottom surface 26a of the InP upper cladding layer 26 is located outward with reference to the position "Q" of one edge of the upper surface 26b of the upper cladding layer 26.

In this step, a mass transport portion 30a is formed on the side of the InP upper cladding layer. The mass transport portion 30a can be formed as follows: mixture of V-group raw material and carrier gas is supplied to the reactor at a temperature, for example 650 degrees Celsius, in the same temperature range as the growth temperature range that provides excellent epitaxial growth. Hydrogen and/or nitrogen can be used as carrier gas. Hydride gas, such as phosphine ($PH_3$), and/or organo-metallic raw material, such as tertiarybutylphosphine (TBP), can be used as V-group raw material containing a phosphorus. In this thermal treatment, the mass transport of indium atoms in the InP lower cladding layer, the active layer of AlGaInAs and the capping layer of InGaAs are caused in the reactor. The mass transport of indium atoms in the active layer of AlGaInAs is less active than that of the InP lower cladding layer. The shape of the mass transport portion 30a depends upon the initial shape of the upper cladding layer 26 in its cross section. The mass transport portion 30a has a side of (110) facet surface of InP and a top of (111) facet B-surface of InP. The mass transport reforms the semiconductor mesa 21 to provide the reformed semiconductor mesa. The addition of the mass transport portion 30a to the side of the upper cladding layer 26 increases the sum of the widths of the upper cladding layer 26 and the mass transport portion 30a in their cross section, so that the minimum width of the reformed semiconductor mesa is in the reformed capping layer. The reformed semiconductor mesa also has upper and lower parts. The upper part is made of the reformed capping layer, and the lower part is made of the remaining of the reformed semiconductor mesa. The shape of the lower part is a normal mesa, and the shape of the reformed capping layer is an inverted mesa. Further, the remaining of the reformed semiconductor mesa is thicker than the reformed capping layer. Therefore, the reformed semiconductor mesa is mostly shaped like a normal mesa.

In the next step, a burying region 30 is grown on the reformed semiconductor mesa 21. The burying region 30 includes one or more semiconductor layer. In one example, the burying region 30 has three-layered structure, and includes a first burying layer 32, a second burying layer 34 and a third burying layer 36. After growing the burying region 30, the original semiconductor mesa 21 is covered with a burying semiconductor portion. The burying semiconductor portion includes the inherent burying region 30 and the mass transport portion 30a, and covers the original mesa 21 and the substrate 10.

Figure 6:
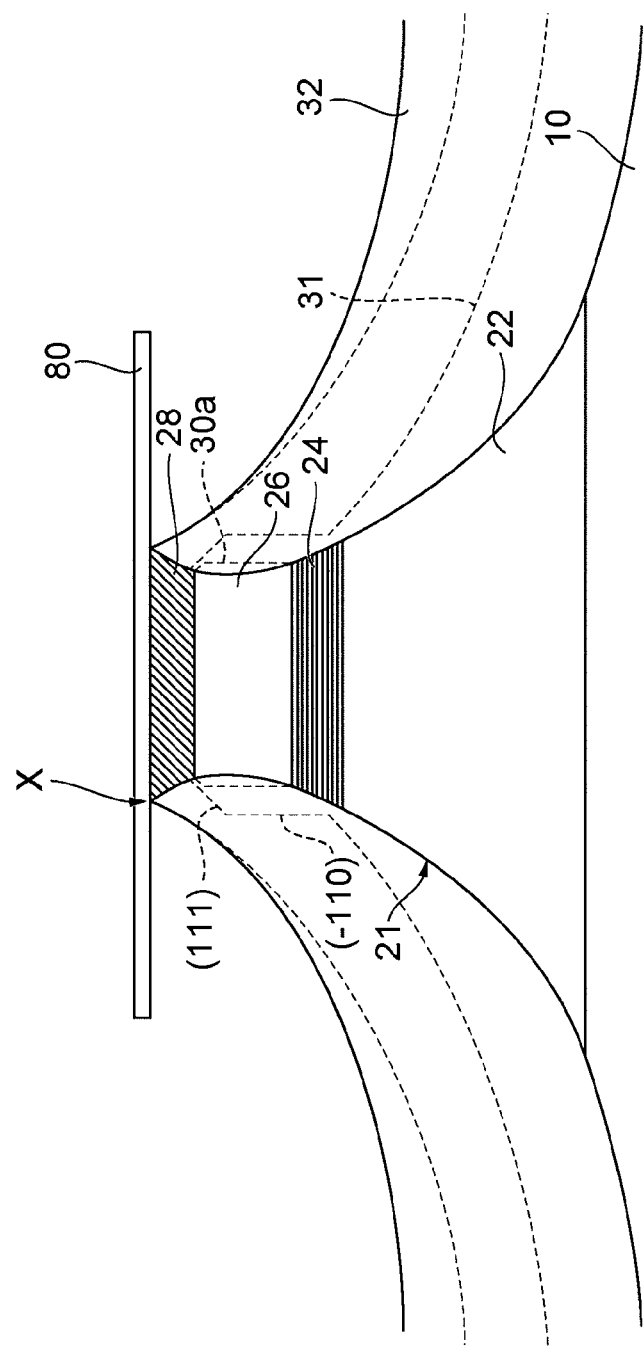
FIG. 6 is a schematic view showing a step of growing a burying layer in the present method.
Figure 7:
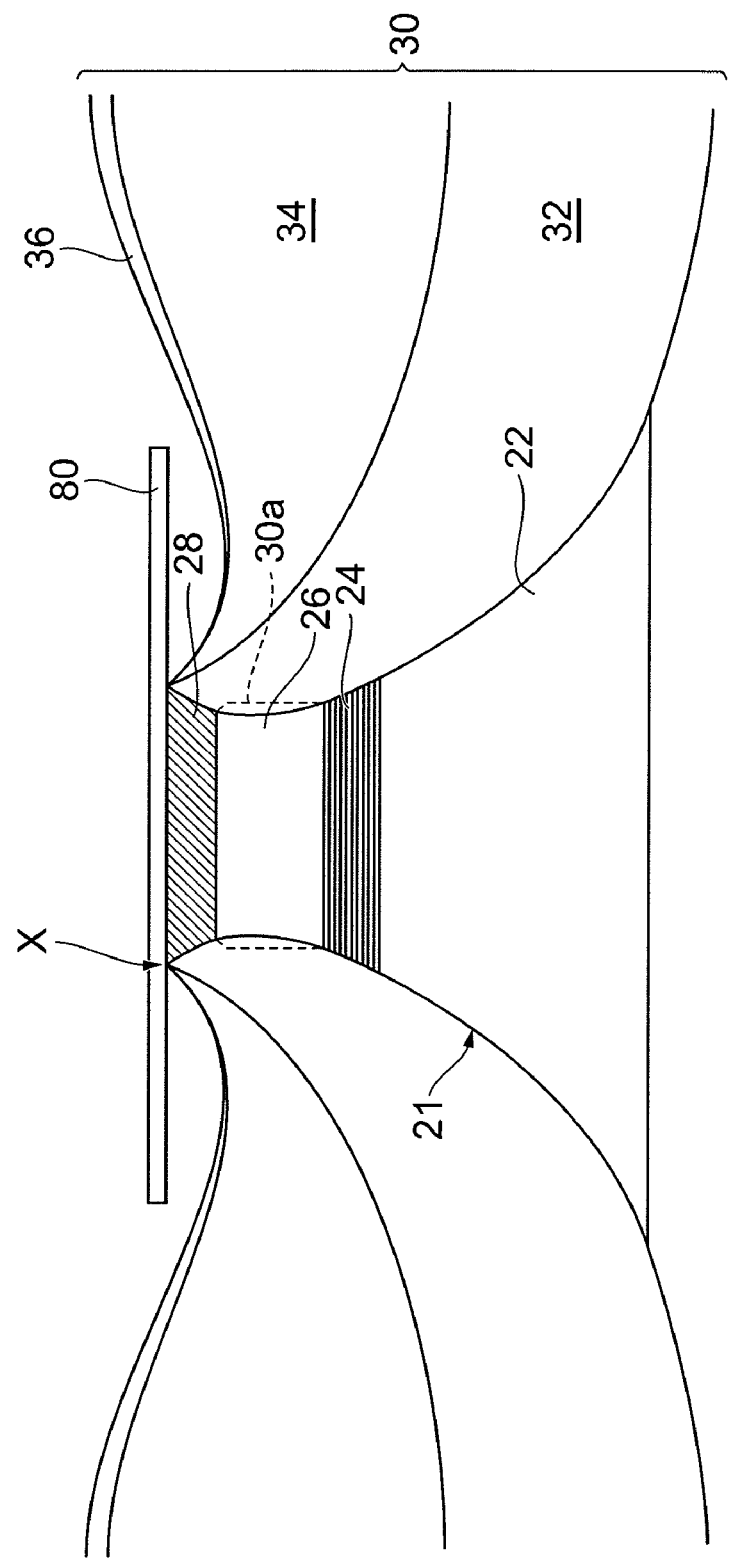
FIG. 7 is a schematic view showing a step of growing a burying layer in the present method.

As shown in FIG. 6, the first burying layer 32 includes an undoped InP layer 31 with which the side of the active layer 24 is covered. The remaining portion of the first burying layer 32 includes a p-type InP layer doped with Zn. The undoped InP layer 31 can prevent p-dopant atoms to diffuse to the active layer 24. The thickness of the undoped InP layer 31 can be about the same as that of the active layer. The thickness of the undoped InP layer 31 can be equal to or less than 0.4 micrometers, and can be equal to or less than one-half times the thickness of the first burying layer 32. Accordingly, the burying layers 32 and 34 include a sufficient amount of p-type dopant and n-type dopant, respectively, to provide excellent current blocking. i.e., to suppress the thyristor operation in the present semiconductor laser. In the preferable example, the undoped InP layer 31 may be grown at a low growth rate, such as two micrometers per hour, to keep (110) surface in the growth of the undoped InP layer 31.

As explained above, (111) facet B-surface is formed at the top of the mass transport portion 30a, and since the growth rate of the burying layer 32 at this (111) surface is slower than that of (110) surface, the growing surface in the growth of the first burying layer 32 is pinned at the position of the bottom of the capping layer. After the (110) surface has disappeared in the growth of the burying layer 32, the surface of (111) facet B-surface grows to cover the side of the capping layer 28 as the burying layer 32 grows. The capping layer 28 has the shape of an inverted mesa, and the growth surface of the burying layer 32 makes an acute angle with the side of the capping layer 28, thereby infilling this gap therebetween promptly. Finally, the growth surface of (111) facet B-surface is pinned at the edge of the top of the capping layer 28.

On the first burying layer 32, a second and third burying layers 34 and 36 are grown sequentially. The second burying layer 34 is made of n-type InP, and the third burying layer 36 is made of p-type InP.

Regarding the layers of the burying layer 30, when the height of the semiconductor mesa 21 is, for example, 2.4 micrometers, the thickness of the undoped InP layer 31 is, for example, 0.1 micrometers; the thickness of the first InP layer 32 is, for example, 1.1 micrometers; the thickness of the second InP layer 34 is, for example, 1.1 micrometers; and the thickness of the third InP layer 36 is, for example, 0.25 micrometers. These thickness values are defined on an area on the flat surface of the substrate, which is far from the mesa.

After forming the burying layer 30, the mask 80 is removed by wet-etching with etchant, such as hydrofluoric acid, and further the capping layer 28 is removed by wet-etching, thereby forming the semiconductor mesa 20 of the semiconductor laser 1 shown in FIG. 1. The removal of the capping layer 28 is carried out by wet-etching with etchant, such as the mixture of phosphoric acid and hydrogen peroxide.

As shown in FIG. 1, the formation of a cladding layer 40 and a contact layer 50 are performed. In this step, the cladding layer 40 and the contact layer 50 are grown on the semiconductor mesa 20 and the burying layer 30 sequentially.

Further, an insulating film is grown on the contact layer 50, and this insulating film is etched by use of lithography technique to form an insulating layer 60 having an opening. The opening has a stripe shape, and is located on the top of the semiconductor mesa 20. The material of the insulating film is, for example, Si-based inorganic film, such as SiN. The width of the opening of the insulating layer 60 can be greater than that of the top of the semiconductor mesa 20. This contact window of this shape effectively controls the flow of injection current from the contact layer 60 to the active layer 24 of the semiconductor mesa 20 in the operation of the semiconductor laser 1.

Finally, a first electrode 70A is formed on the insulating layer 60 and the exposed window portion of the contact layer 50, and a second electrode 70B is formed on the back side of the InP substrate 10, thereby developing the semiconductor laser 1. The formation of the first and second electrodes 70A and 70B can be carried out by use of, for example, a vacuum evaporation apparatus. If required, prior to forming the second electrode 70B, the thickness of the InP substrate 10 can be thinned by back-polishing with the front side of the epi-wafer applied on the support, such as quartz support.

The semiconductor laser 1 has been developed through the above steps.

The inventor has found that the above steps enable the development of the semiconductor laser 1 including the first burying layer 32 with an excellent shape and reproducibility and that the first burying layer 32 has a shape effective in reducing leakage current and reducing its variation. The formation of the first burying layer 32 will be explained below with reference to FIGS. 8 to 10.

Figure 8:
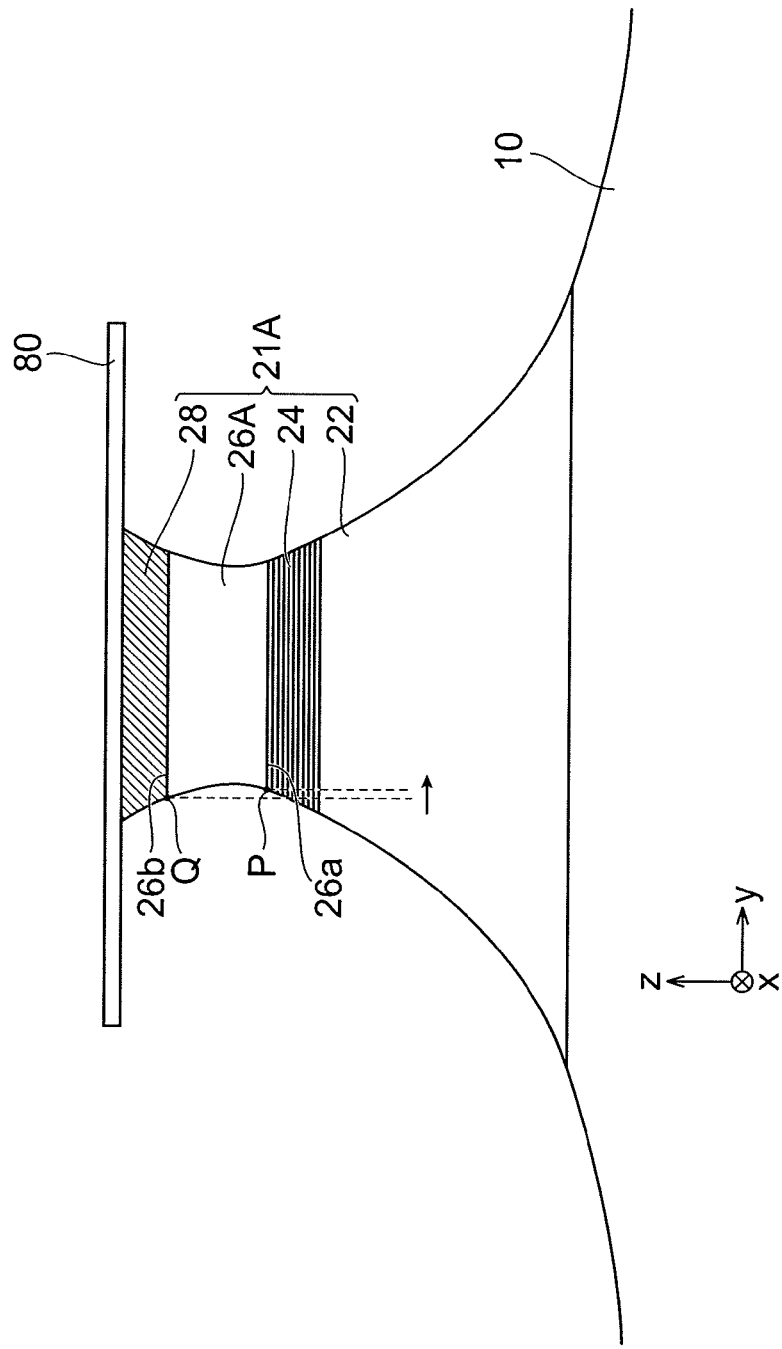
FIG. 8 is a schematic view showing an undesired shape of a semiconductor mesa stripe in a semiconductor laser.
Figure 9:
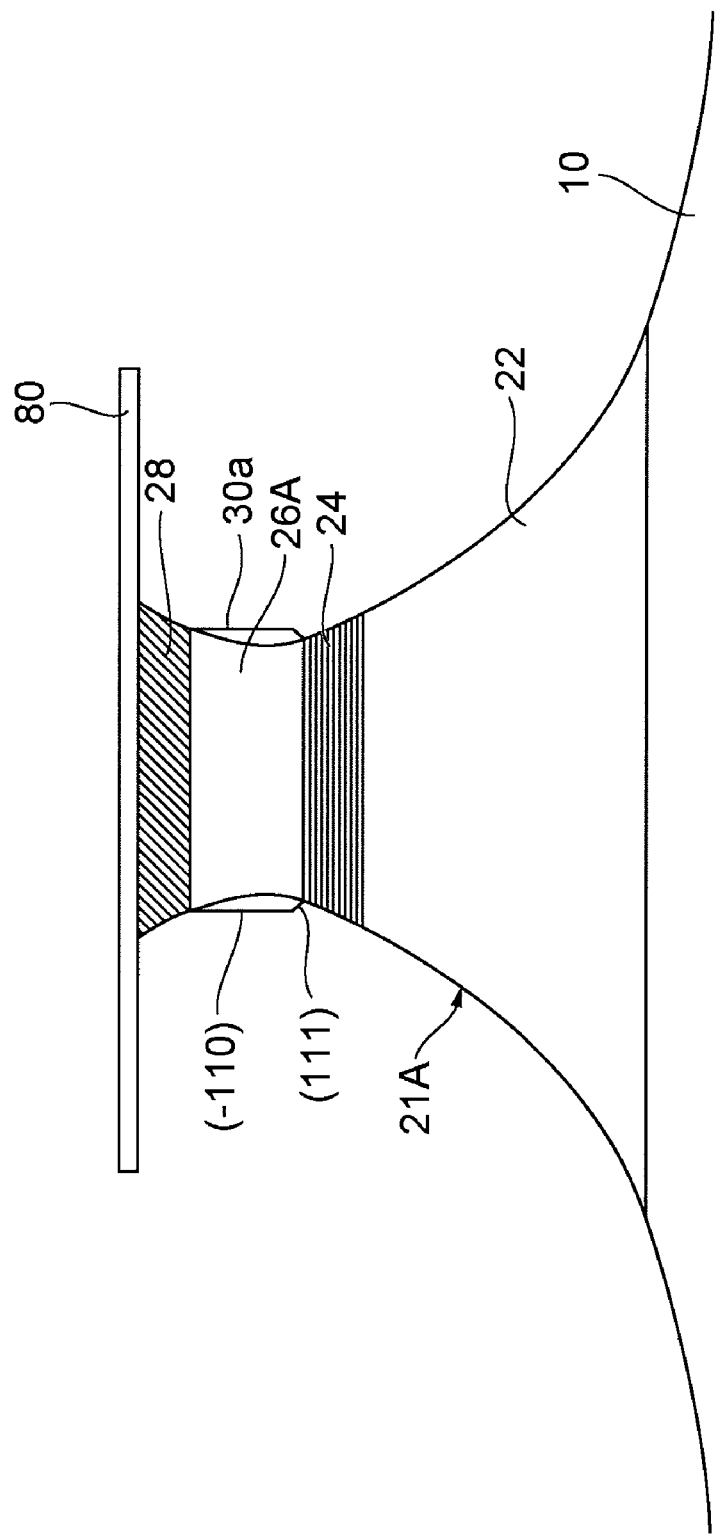
FIG. 9 is a schematic view showing a cross section of the semiconductor mesa stripe shown in FIG. 8 and a mass transport portion is formed thereon.

FIG. 8 shows a cross sectional view, taken along plane perpendicular to the direction in which the semiconductor mesa 21A extends, of a semiconductor laser in which the position "P" of the edge of the bottom surface 26 of the InP upper cladding layer 26A is located inward with reference to the position "Q" of the edge of the upper surface of the upper cladding layer 26A. In the formation of a mass transport portion 30a on the sides of this semiconductor mesa 21A, reflecting the cross sectional shape of the InP upper cladding layer 26A, (111) A-facet is formed at the bottom of the mass transport portion 30a, and (110) facet is formed in the side of the mass transport portion 30a because mass transport on the AlGaInAs is less active, as compared with the upper cladding layer 26A of InP.

Figure 10:
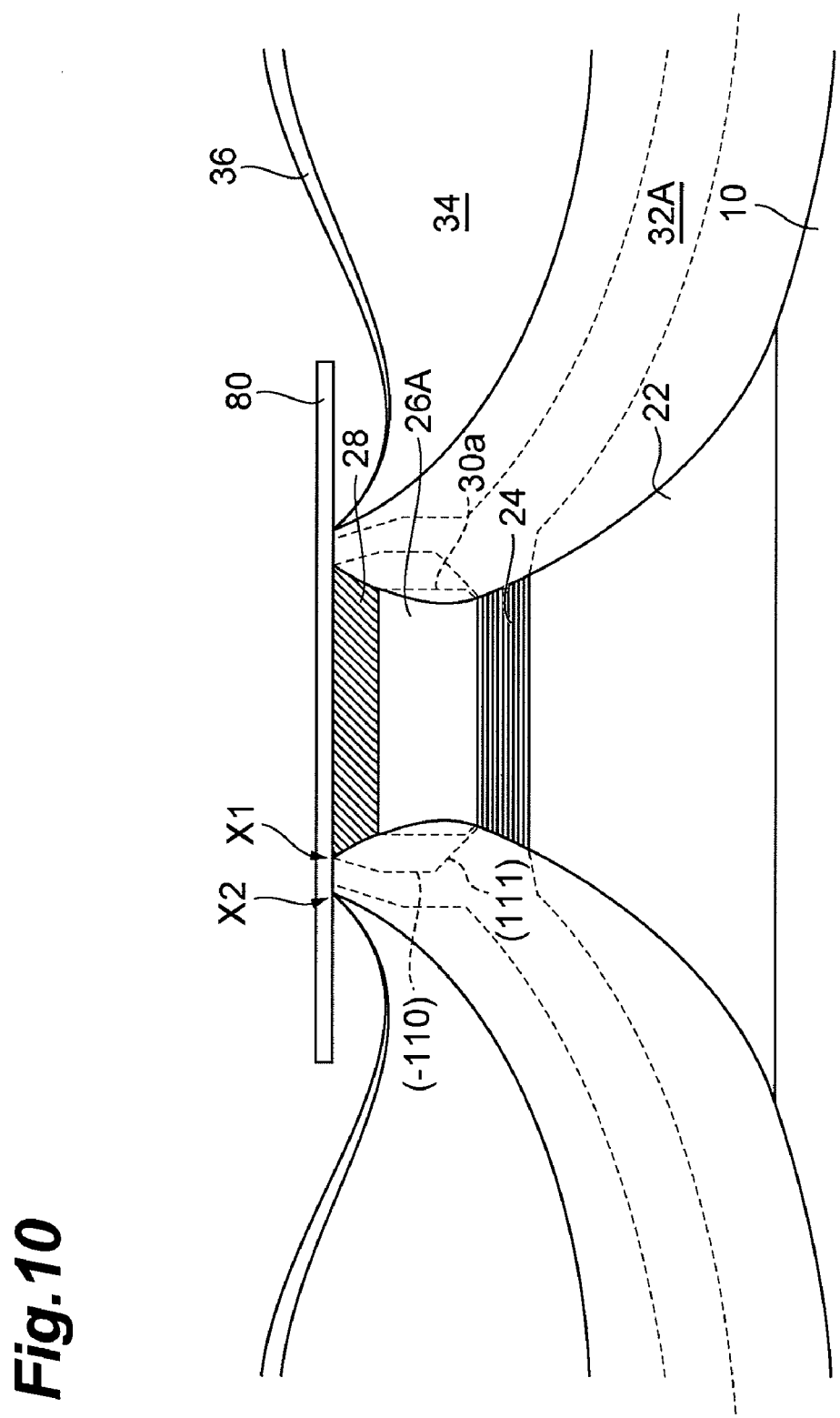
FIG. 10 is a schematic view showing a cross section of the semiconductor mesa on the side of which a burying semiconductor layer is formed.

In the initial growing stage in the growth of the burying layer 32A on the mass transport portion 30a, (110) surface and (111) A-surface of the burying layer grows on (110) surface and (111) A-surface of the mass transport portion 30a as shown in FIG. 10, respectively. Accordingly, in the initial growing stage, an upper semiconductor part for the burying layer 32A grows on the side of the upper cladding layer, which is located above the active layer in the semiconductor mesa 20, and a lower semiconductor part for the burying layer 32A grows on the side of the lower cladding layer, which is located below the active layer in the semiconductor mesa 20. The lower and upper semiconductor parts is separated from each other because the growth rate of semiconductor for the burying layer 32A on the side of the active layer is much smaller than that of semiconductor for the burying layer 32A on the sides of for the upper and lower cladding layers, thereby forming a groove in the semiconductor grown on the side of the semiconductor mesa. In the next stage that follows the initial growing stage, the upper and lower semiconductor parts are connected with each other to cover the side of the active layer with the burying layer 32A.

Figure 11:
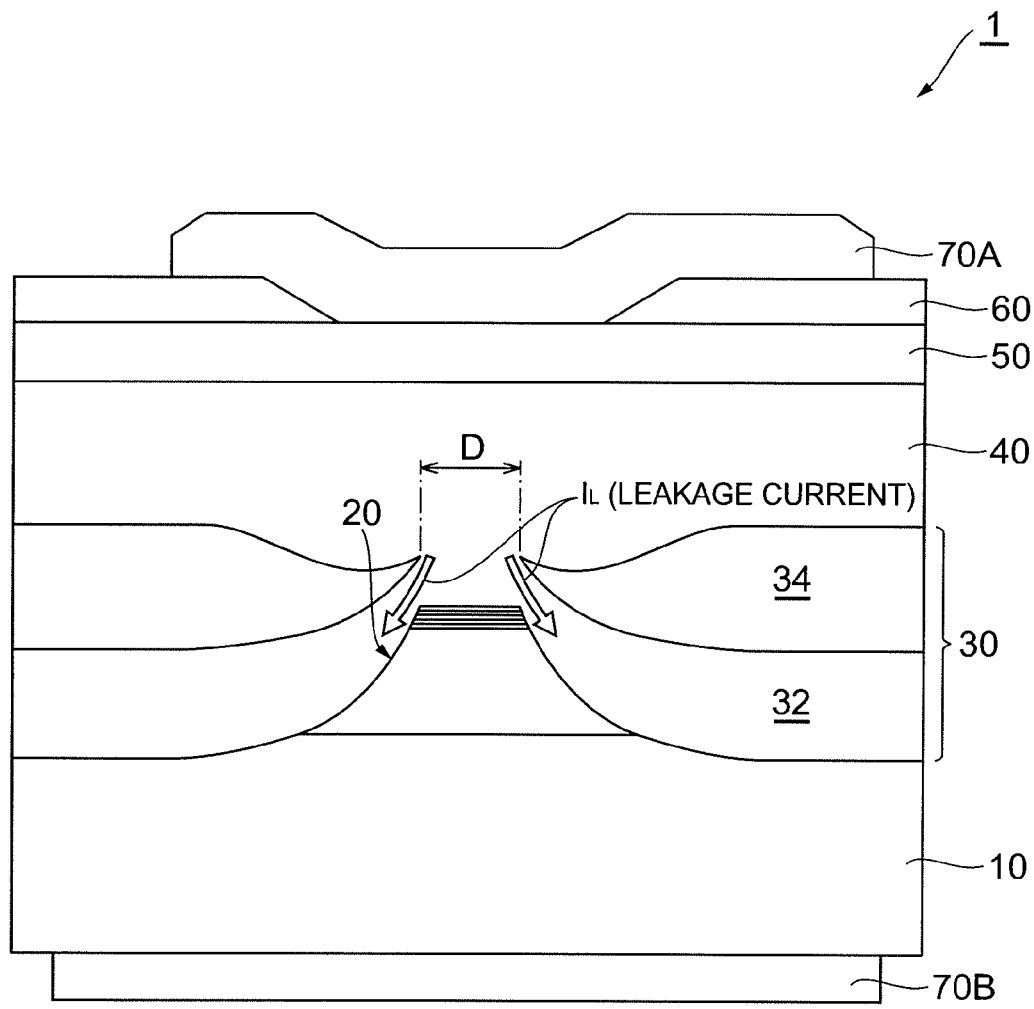
FIG. 11 is a schematic view showing the leakage current pass in a semiconductor laser.

The occurrence of the groove in the growth of the burying layer 32A makes the controllability of epitaxial growth poor, so that, under the mask layer 80, the distance between the edge (position "X1" in FIG. 10) of the top surface of the capping layer 28 and the edge (position "X2" in FIG. 10) of the growing surface of the burying layer 34A becomes large. This separation is caused as follows: in the initial growth stage, since the growth rate of the burying layer 32 on the side of the AlGaInAs active layer, which is located below the mass transport portion, is smaller than others, a deposition for the burying layer 32A on the top and side of the mass transport portion 30a is formed thicker, as compared with the side of the AlGaInAs active layer, to reach the edges of the capping layer 28, and then the deposition for the burying layer 32 further grows in the transverse direction along the mask 80. Consequently, this transverse growth makes the distance between the upper edges of the burying layer 32A large, and since the burying layer 34 is grown on the burying layer 32A, the distance between the upper edges of the burying layer 34 is made large. As shown in FIG. 11, the distance "D" becomes great, thereby increasing the leakage current that flows in the pass as indicated by the arrow in the figure.

Further, since the controllability of the above growth of the burying layer is not good, the distance between the edge (position "X1") of the upper surface of the capping layer 28 and the edge (position "X2") of the growth surface of the burying layer 32 cannot be controlled properly, thereby increasing the variation of the distance device by device. Therefore, the amount of leakage current that depends on the distance "D" also varies a great deal device by device, leading to the cause of unwanted device characteristics.

On the other hand, the fabrication method of the semiconductor laser 1 can prevent the separation of the burying layer in the initial growth stage, thereby leading to the excellent controllability of epitaxial growth of the burying layer. Therefore, the surface of the burying layer 32 starts at or around the edge of the upper surface of the capping layer 28. The surfaces of the burying layer 32 have inner edges that are located on both sides of the semiconductor mesa 20, respectively, and these edges are made close to each other.

Accordingly, the burying layer 34 has a pair of surfaces that are located on both top surfaces of the burying layer 32, respectively, and each surface of the burying layer 34 has an inner edge. These inner edges are also made close to each other, so that the distance "D" between the edges of the burying layer 34 that are located on both sides of the semiconductor mesa 20, respectively, is made shortened, thereby reducing the amount of the leakage current.

since the position of the edge of the top surface of the burying layer 32 is close to or the same as that of the top surface of the capping layer 28, the burying layer 32 is positioned to the semiconductor mesa 20 with high positional accuracy. Therefore, the variation in the distance "D" is reduced in the semiconductor laser to obtain the size equalization, which also equalizes the amount of the leakage current, thereby reducing the variation in the device by device characteristics.

As explained above, in the semiconductor laser 1 that is fabricated in the above method, the InP burying layer 30 includes the burying layer 32 and 34, and is formed to obtain its high accuracy in size and shape, thereby effectively reducing the amount of the leakage current. The formation of the burying layer 30 can be controlled with high accuracy in shape, leading to the reduction of variation in device by device characteristics.

It is known that the diffusion of zinc atoms in the burying layer 30 to the active layer 24 facilitate to form nonradiative recombination centers in the active layer 24, thereby deteriorating the device characteristics and device reliability. The (110) surface has a quite high ability to incorporate zinc thereinto. In the initial stage of the growth of the first burying layer 32, (110) surface of the first burying layer 32 grows on (110) surface of the mass transport portion 30a, and the surface of the first burying layer 32 and the side of the active layer are very close to each other, so that the diffusion of zinc in the first burying layer 32 to the active layer 24 may be easily caused.

In order to reduce the effect of the diffusion in the present fabrication method, the layer 31 of undoped semiconductor is grown in the initial growth stage for the burying layer 30. This growth of the undoped semiconductor prevents zinc from diffusing into the active layer, thereby improving the optical efficiency of the semiconductor laser 1. Zinc atoms in the burying layer 32 diffuse into the undoped semiconductor by heating in the subsequent growth steps to change its conductivity type, i.e., n-type to p-type. When the semiconductor laser 1 has been developed, then the conductivity type of the undoped semiconductor has changed into p-type, which contribute to the reduction of the leakage current.

When the thickness of the undoped InP layer 31 is changed with the burying layer 30 remaining unchanged, the threshold current is lowered as the thickness of the undoped InP layer 31 is made thick in the thickness which is equal to or less than 0.4 micrometers, thereby lowering the threshold current and increasing the optical power. When the thickness of the undoped InP layer 31 is thicker than 0.4 micrometers, zinc dopant atoms do not diffuse into the entire undoped InP layer 31, so that undoped InP part, i.e., n-type InP in left in the burying layer 31. Leakage current may flow through this undoped InP part of n-type that is on the side of the semiconductor mesa 20. If any, the conductivity of the entire undoped InP layer 31 can be changed to p-type by adjusting the heating time and/or heating temperature to ensure the diffusion of zinc. It is preferable that the thickness of the undoped InP layer 31 be equal to or less than 0.3 micrometers in order to obtain the assembled semiconductor laser that enables the direct modulation of 10 Gbit per second in a package for optical communications. This is because the temperature falling time "$t_F$" becomes long as the undoped InP layer 31 becomes thick, which lowers the zinc dopant concentration of the InP layer 31 to grow the depletion layer at the junction of the burying layer, thereby causing the delay due to the increase of parasitic capacitance.

Having described and illustrated the principle of the invention in a preferred embodiment thereof, it is appreciated by those having skill in the art that the invention can be modified in arrangement and detail without departing from such principles. Details of steps and devices of the methods and devices can be modified as necessary. We therefore claim all modifications and variations coming within the spirit and scope of the following claims.

What is claimed is:

1. A method of fabricating a semiconductor optical device, the method comprising the steps of:
   forming a semiconductor region including an InP lower cladding layer, an active layer, an InP upper cladding layer and a capping layer sequentially, the capping layer being made of InGaAs, the active layer being made of aluminum-based III-V compound semiconductor;
   forming an oxidation layer by oxidizing a surface of the capping layer made of InGaAs layer:
   forming an insulating film on the oxidation layer;
   etching the insulation film to form a mask having a stripe shape, the mask being formed on the oxidation layer;
   etching the semiconductor region using the mask to form a semiconductor stripe mesa, the semiconductor stripe mesa including the InP lower cladding layer, the active layer, the InP upper cladding layer and the capping layer, a width of a top surface of the capping layer being greater than that of a bottom surface of the capping layer, a width of a top surface of the InP upper cladding layer being smaller than that of a bottom surface of the InP upper cladding layer, and a minimum width of the semiconductor stripe mesa being in the InP upper cladding layer;
   after forming the semiconductor stripe mesa, performing a thermal process of the semiconductor stripe mesa in an atmosphere to form a mass transport semiconductor on a side of the InP upper cladding layer, the atmosphere including V-group material containing a phosphorus; and
   After performing the thermal process, growing an InP burying layer on the substrate and the semiconductor stripe mesa by epitaxial growth.

2. The method according to claim 1, wherein etching the semiconductor region includes the steps of:
   selectively etching the capping layer of the semiconductor region using a first etchant; and, after selectively etching the capping layer, etching a remaining portion of the semiconductor region using a second etchant, and wherein the first etchant has an etching rate of InGaAs greater than that of InP.

3. The method according to claim 2, wherein the second etchant contains Br alcohol.

4. The method according to claim 1, wherein growing the InP burying layer includes the steps of: growing an undoped InP layer; a first InP layer doped with one of p-type dopant and n-type dopant; a second InP layer doped with another of p-type dopant and n-type dopant, and the undoped InP layer is grown on the side of the active layer and the mass transport semiconductor on the of the InP upper cladding layer.

5. The method according to claim 1, wherein the mass transport semiconductor is made of III-V compound and has a side surface, and the side surface includes one of (-110) and (1-10) of the III-V compound.

6. The method according to claim 1, wherein the active layer includes an AlGaInAs semiconductor layer.

7. The method according to claim 1, wherein the atmosphere contains at least one of phosphine and V-group organic metal material containing a phosphorus.

8. The method according to claim 1, wherein a width of a top surface of the active layer is greater than that of a bottom surface of the active layer.

9. The method according to claim 1, the method further comprising the step of, after growing the InP burying layer, removing the capping layer.

10. The method according to claim 9, the method comprising the step of, after removing the capping layer, growing another InP upper cladding layer on the semiconductor stripe mesa and the InP burying layer.

11. The method according to claim 1, wherein the thermal process is performed in a reactor, and III-group organic metal raw material is not supplied to the reactor during the thermal process.

12. The method according to claim 1, the method further comprising the step of preparing a substrate, the substrate having a primary surface, and the semiconductor region is formed on the primary surface.

13. The method according to claim 1, wherein the semiconductor stripe mesa extends in x-axis of a Cartesian coordinate system;
the top surface of the InP upper cladding layer has first and second edges, and the first and second edges extend in the x-axis of the Cartesian coordinate system;
the bottom surface of the InP upper cladding layer has third and fourth edges, and the third and fourth edges extend in the x-axis of the Cartesian coordinate system;
the first to fourth edges have first to fourth y-coordinate positions in y-axis of the Cartesian coordinate system, and first and second y-coordinate positions are between third and fourth y-coordinate positions on the y-axis of the Cartesian coordinate system;
and
the InP lower cladding layer, the active layer and the InP upper cladding layer are arranged on the primary surface in z-axis of the Cartesian coordinate system.

14. The method according to claim 1, wherein the semiconductor optical device includes a semiconductor laser.

15. The method according to claim 1, wherein in the step of forming an oxidation layer, the capping layer made of InGaAs layer is oxidized in the atmosphere containing oxygen.

16. The method according to claim l, wherein the insulating film is made of silicon oxide, silicon nitride or silicon oxynitride.

* * * * *